United States Patent
Hu

(10) Patent No.: US 7,386,822 B1
(45) Date of Patent: Jun. 10, 2008

(54) SIMULTANEOUS TIMING-DRIVEN FLOORPLANNING AND PLACEMENT FOR HETEROGENEOUS FIELD PROGRAMMABLE GATE ARRAY

(75) Inventor: Bo Hu, San Jose, CA (US)

(73) Assignee: Cswitch Corporation, Santa Clara, CA (US)

( * ) Notice: Subject to any disclaimer, the term of this patent is extended or adjusted under 35 U.S.C. 154(b) by 420 days.

(21) Appl. No.: 11/304,024

(22) Filed: Dec. 15, 2005

(51) Int. Cl.
G06F 17/50 (2006.01)

(52) U.S. Cl. .................. 716/8; 716/9; 716/10; 716/11

(58) Field of Classification Search ............... 716/8–11
See application file for complete search history.

(56) References Cited

U.S. PATENT DOCUMENTS

| | | | | |
|---|---|---|---|---|
| 5,309,371 A | * | 5/1994 | Shikata et al. | 716/10 |
| 5,398,195 A | * | 3/1995 | Kim | 716/10 |
| 6,054,873 A | * | 4/2000 | Laramie | 326/39 |
| 6,243,851 B1 | * | 6/2001 | Hwang et al. | 716/10 |
| 6,260,179 B1 | * | 7/2001 | Ohsawa et al. | 716/5 |
| 6,560,505 B1 | * | 5/2003 | Kikuchi et al. | 700/121 |
| 6,631,508 B1 | * | 10/2003 | Williams | 716/8 |
| 6,980,029 B1 | * | 12/2005 | Vittal et al. | 326/41 |
| 7,146,590 B1 | * | 12/2006 | Chaudhary | 716/5 |
| 7,149,994 B1 | * | 12/2006 | Dasasathyan et al. | 716/10 |
| 7,197,735 B2 | * | 3/2007 | Martin et al. | 716/8 |
| 7,210,112 B2 | * | 4/2007 | DeHon et al. | 716/9 |
| 7,285,487 B2 | * | 10/2007 | DeHon et al. | 438/618 |
| 2005/0063373 A1 | * | 3/2005 | DeHon et al. | 370/380 |
| 2007/0150846 A1 | * | 6/2007 | Furnish et al. | 716/8 |
| 2007/0214445 A1 | * | 9/2007 | DeHon et al. | 716/10 |

\* cited by examiner

*Primary Examiner*—Vuthe Siek
*Assistant Examiner*—Naum Levin
(74) *Attorney, Agent, or Firm*—Peter Su

(57) ABSTRACT

A timing-driven simultaneous placement and floorplanning method based on a multi-layer density system for heterogeneous field programmable gate arrays are disclosed. The field programmable gate arrays are designed with heterogeneous resources including look-up tables, memory blocks and dedicated logic blocks. Each layer in the multi-layer density system is modeled with a different architectural resource. The placement of look-up tables and the floorplan of computational blocks are concurrently determined in the multi-layer density system. A dynamic timing optimization scheme is also seamlessly integrated in the placement process.

17 Claims, 8 Drawing Sheets

516 and 526

536 and 546

SIMULTANEOUS TIMING-DRIVEN FLOORPLANNING AND PLACEMENT FOR HETEROGENEOUS FIELD PROGRAMMABLE GATE ARRAY

BACKGROUND OF THE INVENTION

1. Field of the Invention

The present invention relates generally to programmable chips, and more particularly to floorplanning and placement of field programmable integrated circuits (ICs).

2. Description of Related Art

Field programmable gate arrays (FPGAs) are often selected by designers to provide a flexible approach in programming and re-programming integrated circuits in order to accommodate a system specification, correct errors in the system, or make improvements to the system by reprogramming the field programmable gate array. One conventional field programmable gate array architecture is implemented using groups of look-up tables and programmable interconnect circuits. While the look-up tables and sequential elements are connected to each other, the connections to the groups of look-up tables typically originate from a switchbox located in each group of the look-up table. A hierarchical interconnect structure connects to elements in a look-up table through a switchbox, thereby serving as the primary source of connecting look-up tables from one logic block to another logic block. The inputs to the look-up tables are therefore generated primarily from the switch box. The look-up table outputs are directly fed to other look-up tables as well as the elements within the look-up tables, but the connections to other look-up tables' inputs are made through the switch box.

Although field programmable gate arrays enable user programming of integrated circuits, these integrated circuits typically produce slower performance (clock speed) because of the delays through the transistors, switches or multiplexers used to program the interconnects between configurable logic elements. Each logic element can be connected to a multitude of other logic elements through switches in which the path from one programmable logic element to the next may be strewn with many switches, slowing down circuit operation. Some paths in a programmable IC are not as critical as others. Therefore, a customized programmable IC can be designed such that speed in the critical paths are optimized over other non-critical paths.

Routing elements have increasingly been added to programmable logic devices/ICs so that routing elements now typically occupy a much larger area than the configurable logic elements themselves. Adding to the problem is the fact that routing delays are typically much greater than logic delays, resulting in a slow operating clock frequency. In a conventional implementation, a large fraction of the routing elements may be redundant.

As semiconductor process advances into deep sub-micron regime, the cost of manufacturing a complex Application-Specific Integrated-Circuit (ASIC) chip using the state-of-art technology is sky-rocketing. As a viable solution to reduce cost, shorten product development cycle while minimizing production risk, field programmable gate array has been gaining acceptance in various applications than ever before. Traditional homogeneous field programmable gate array is mainly based on programmable Look-Up Tables (LUTs). Its logic density and performance are usually inferior to ASIC implementation. However, as the leading-edge technology is more rapidly adopted in field programmable gate array industry, and more ASIC-like dedicated functional blocks are integrated nowadays, the overall density and performance disadvantages are mitigated in modern high-end field programmable gate arrays. The integration of such dedicated blocks marks the transition from homogeneous architecture to heterogeneous. Consequently due to the shift to the heterogeneous architecture, it is desirable to optimize the economy of space on an integrated circuit chip with a more efficient method and system for the placement of heterogeneous blocks.

SUMMARY OF THE INVENTION

The present invention describes a timing-driven simultaneous placement and floorplanning method based on a multi-layer density system for heterogeneous field programmable gate arrays. The field programmable gate arrays are designed with heterogeneous resources including look-up tables, memory blocks and dedicated logic blocks. Each layer in the multi-layer density system models a different architectural resource. The placement of look-up tables and the floorplan of computational blocks are concurrently determined in the multi-layer density system. A dynamic timing optimization scheme is also seamlessly integrated in the placement process.

Broadly stated, a method for placement of functional blocks using a multi-layer density system on a heterogeneous field programmable gate array comprises generating a first geometric shape for a functional block in a first layer, the functional block including one or more functional units of a first type; generating a second geometric shape for the functional block in a second layer, the functional block including one or more functional units of a second type; computing a density distribution separately for the first geometric shape in the first layer and the second geometric shape in the second layer; and determining whether each layer has an even layer density distribution.

Advantageously, the close interactions between the placement, floorplanning and timing optimization in the present invention produces superior timing results for industrial designs.

The structures and methods regarding to the present invention are disclosed in the detailed description below. This summary does not purport to define the invention. The invention is defined by the claims. These and other embodiments, features, aspects, and advantages of the invention will become better understood with regard to the following description, appended claims and accompanying drawings.

BRIEF DESCRIPTION OF THE DRAWINGS

The invention will be described with respect to specific embodiments thereof, and reference will be made to the drawings, in which:

FIG. 6 is a simplified block diagram illustrating a first density layer showing a complex shape of look-up tables density layer from the computation block in accordance with the present invention.

DETAILED DESCRIPTION

Figure 1:
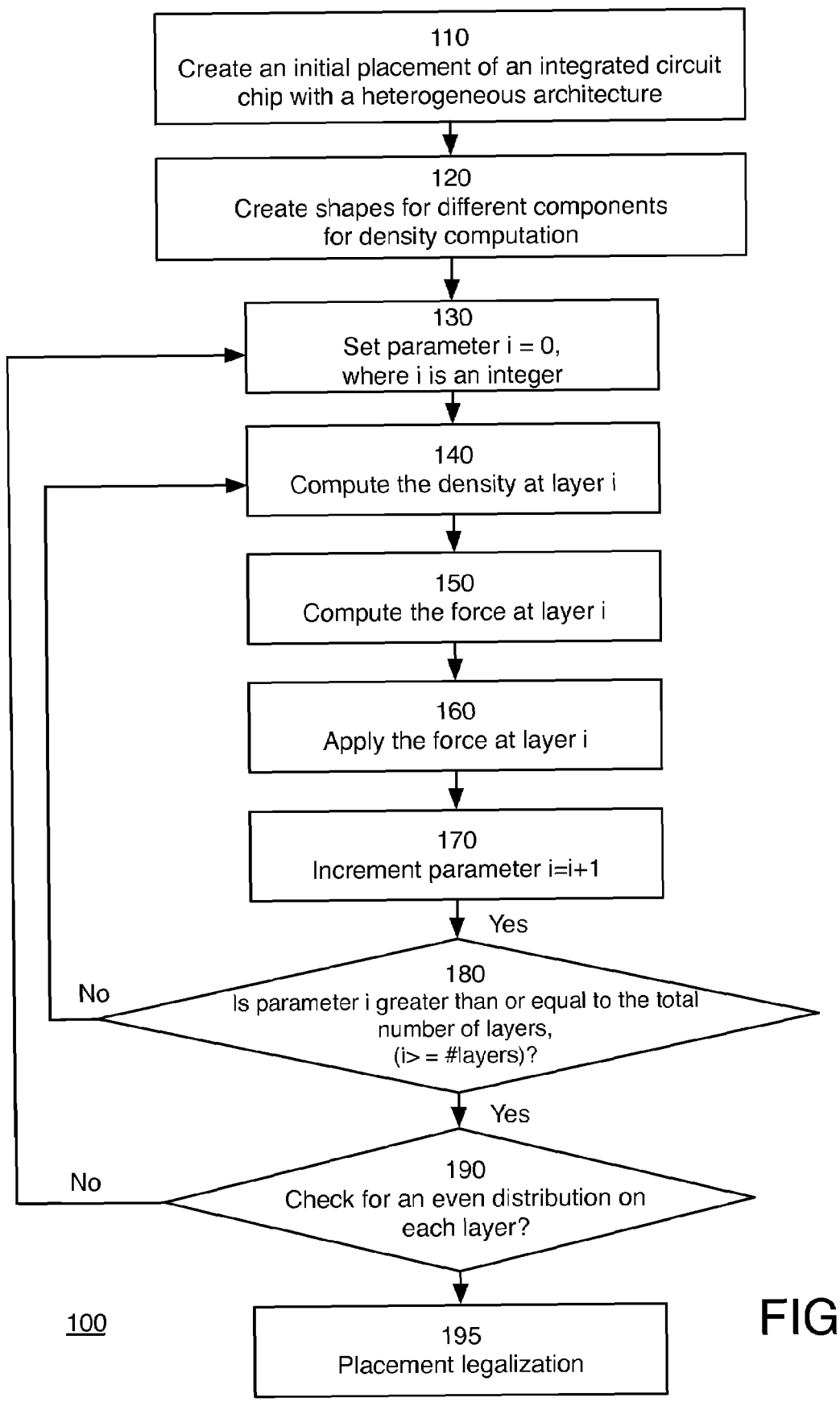
FIG. 1 is a simplified flow diagram illustrating the process of a timing-driven placement method based on a multi-layer density system for handling placement requirements in a heterogeneous field programmable gate array employing heterogeneous resources in accordance with the present invention.

Heterogeneous architectures present challenges for field programmable gate array design tools such as, for example, placement tool. Given a netlist of design components, the task of a timing-driven placer is to assign components into the proper locations on a target field programmable gate array chip while optimizing design performance. A component might be as simple as a single look-up table or it can also be a complex functional block.

A typical timing-driven field programmable gate array placement algorithm was based on simulated annealing. It might be possible to adapt simulated annealing to handle heterogeneous field programmable gate array architectures. However, the excessive CPU-complexity of simulated annealing deters it from being an attractive solution. Analytical placement in recent time has regained attention in design automation world due to its superior speed and excellent placement quality. Classical analytical placement algorithm is adopted mostly in standard-cell based ASIC designs. The inputs to an analytical placer are a graph representing the design netlist and a region specifying where the netlist should be placed. If the placer is timing-driven, it also reacts to timing analysis results to produce an optimized timing result. Each node in the graph is assigned a geometric shape. The output of the placer is an overlapping-free placement of all the nodes in the graph. Two nodes overlap if their geometric shapes intersect with each other. One way of handling the non-overlapping requirement is through density $D(x,y)$. The density $D(x,y)$ is defined for every location $(x,y)$ within the placement region. It quantifies the amount of overlapping at $(x,y)$. Suppose that each node contributes a unit density to any location where its shape covers. By ensuring that the density at any location is equal or less than a unit density, the placer automatically produces an overlapping-free placement. For standard-cell based ASIC designs, the geometric shape assigned to a node is usually a rectangle. During the placement, rectangles are mapped onto the placement region to compute density distribution. The placement is done when the peak density is less than a threshold value and/or other criteria are met. Since the density $D(x,y)$ is a two-dimension function, it is referred to as a single-layer density system. The single-layer density layer in this system refers operates in xy plane.

As the following example demonstrates, for field programmable gate arrays with heterogeneous resources, using single-layer density system makes it hard to choose an appropriate geometric shape for a placement node. Let's suppose that the design to be placed comprises computing units (CUs) and look-up tables. Because look-up table distribution has the finest granularity, it can be conceptually viewed as being available everywhere. The terms $W/W_{LUT}$ and $H/H_{LUT}$ are used to annotate the width and height of the rectangle shape for a look-up table. The parameter W represents the width of the placement region, and the term $W_{LUT}$ represents the number of look-up table columns. Therefore, the term $W/W_{LUT}$ represents the average width of a look-up table column. Similarly, the term $H/H_{LUT}$ defines the average height of a look-up table row. For a computing unit, the selection of a geometric shape is more involved to determine. A computing unit is much more sparsely distributed across the chip relative to a look-up table. As a result, average column width $W/W_{CU}$ and average row height $H/H_{CU}$ are much larger than their counterparts for look-up table. If the terms $W/W_{CU}$ and $H/H_{CU}$ are used to generate a rectangle shape, non-overlapping placement prevents look-up table components from using the available look-up table resources covered by the shape. Conversely, if a computing unit is assigned with a smaller geometric shape, a group of computing unit components might be closely located in some local region where there insufficient computing unit resources available. To reduce the demand, some computing unit components need to be moved away from their optimized positions. Because these heterogeneous resources like computing units are sparsely distributed, finding the nearest resource might still incur significant placement disturbance. As a result, placement quality (timing, routability, etc.) is likely to be damaged.

Referring now to FIG. 1, there is shown a flow diagram illustrating the process of a timing-driven placement method 100 for handling placement requirements in a heterogeneous field programmable gate array employing heterogeneous resources based on a multi-layer density system. The method 100 operates in a multi-layer density system where each layer modeling can represent a different architectural resource. With the multi-layer density system, the placement of look-up tables and the floorplan of complex computational blocks are concurrently determined. A dynamic timing optimization scheme is also seamlessly integrated in the placement process. The tight interaction between the placement, floorplanning and timing optimization produces, for example, about 30% or better timing results for industrial designs.

At step 110, the method 110 creates an initial placement of an integrated circuit chip with a heterogeneous architecture with heterogeneous resources including look-up tables, memory blocks, computing units, and floating point units. The method 100 at step 120 creates a shape for each different component for subsequent density computation. At step 130, the method sets a parameter i to zero, where i is an integer number. At step 140, the method starts the computation of density at layer i. The method computes the force at the layer i at step 150. The parameter i is incremented by one at step 170. At step 180, the method determines whether the parameter i is greater than or equal to the total number of layers, represented mathematically as $i \geq$ the number of layers. If the parameter i is not greater than or equal to the total number of layers, the method 100 returns to step 140 to once again computes the density at layer i. The steps 140, 150, 160, 170 and 180 form a loop in the density calculations. If the parameter i is greater than the total number of layers, the method 100 continues to step 190 to check for an even distribution on each layer. If the density distribution on each layer is not even, the method 100 return to step 130.

Otherwise, if the density distribution on each layer is found to be even, the process performs placement legalization at step 195.

Figure 2:
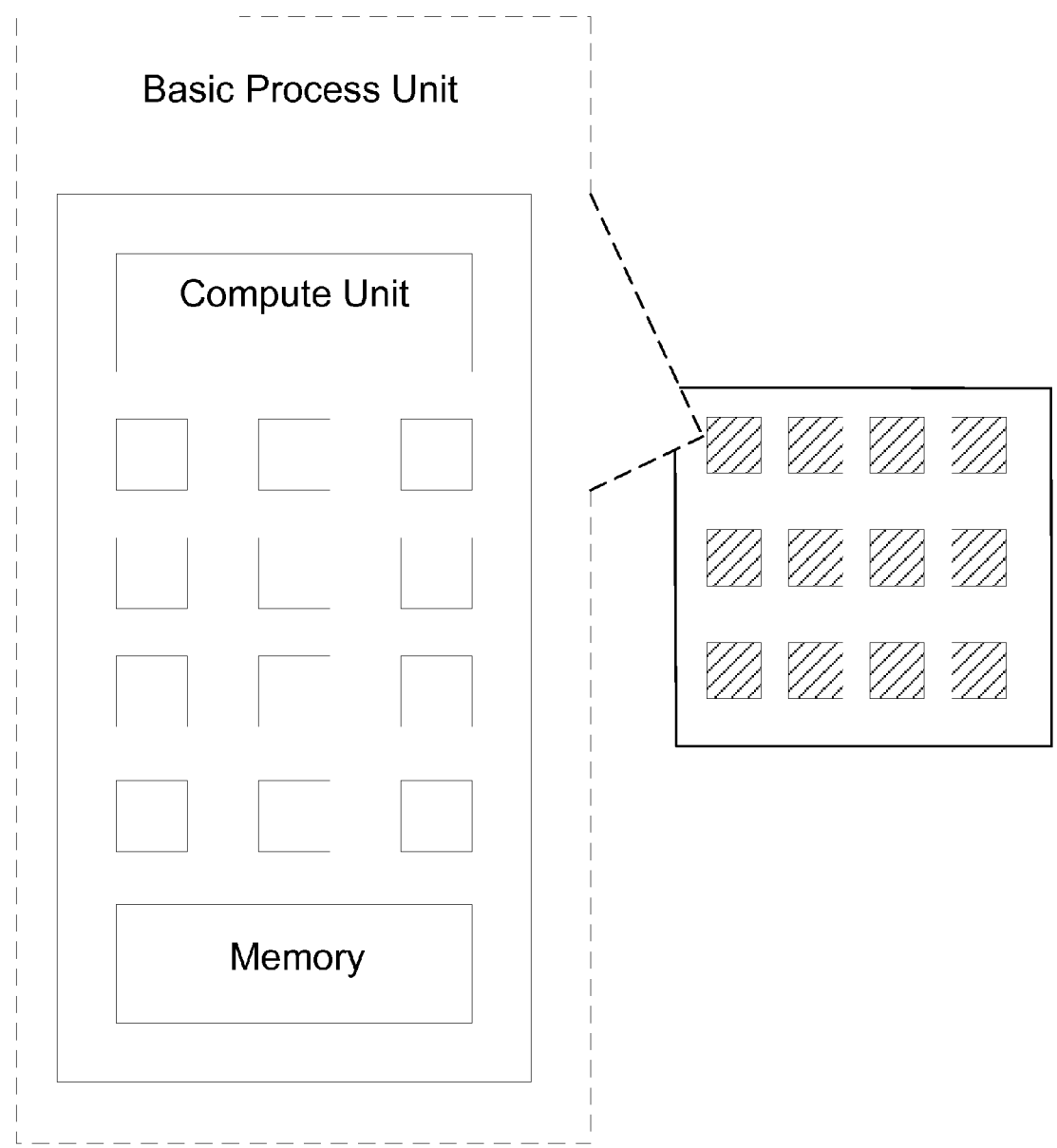
FIG. 2 is a simplified block diagram illustrating a basic process unit in a heterogeneous field programmable gate array in accordance with the present invention.

As illustrated in FIG. 2, there is shown a simplified block diagram illustrating a basic process unit (BPU) in a heterogeneous field programmable gate array. Each BPU contains a two-dimension array of look-up tables, a computing unit (CU) and a memory block. The term "heterogeneous field programmable gate arrays" refer to those architectures with heterogeneous resources (such as computing units, memory blocks, look-up tables, floating point units, dedicated logic blocks, dedicated lines) embedded sparsely in homogenous look-up table distribution.

Figure 3:
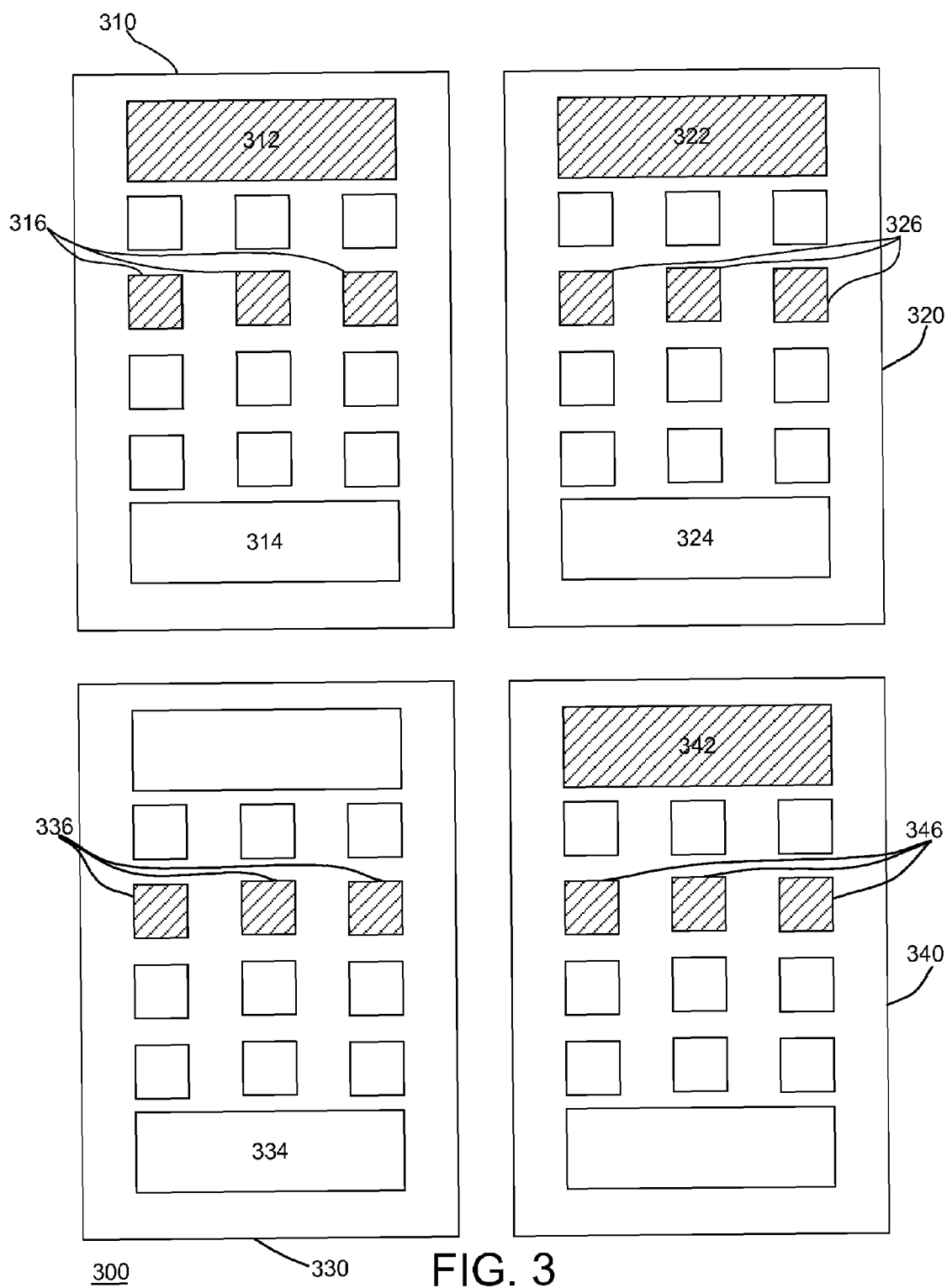
FIG. 3 is a simplified block diagram illustrating an example of a computational block of the basic process unit in the field programmable gate array in accordance with the present invention.

The inputs to the timing-driven placement concerns are addressed as follows. The first concern relates to an architectural description for the target heterogeneous field programmable gate array chip. A placement region with width W and height H is built based on the description. The parameters $W_X$ and $H_X$ represent the number of columns and rows respectively for resource type X so that the total number of resources of type X is represented as $W_X \times H_X$. The second concern relates to a design of M(C, I). The parameters C and I denote the set of components and interconnects respectively. Each interconnect i(D,R) in I connects a subset of C. The parameter D represents the set of driving components and the parameter R represents the set of receiving components. A connection in the design is defined as a driver and receiver component pair $p(u \in C, v \in C)$. Each connection is annotated with a slack $s_p$ based on static timing analysis. The parameter $s_{worst}$ represents the worst slack among all connections. Slack is a metric to measure how well the actual timing meets design requirements. The larger $s_{worst}$ usually suggests that the design can function correctly at a higher clock frequency. A component comprises a terminal, a look-up table, a computational block, or a floating point unit. A terminal is an interface of the design to outside environment. In one embodiment, all terminals have fixed locations. A computational block (CB) refers to a pre-designed functional block implemented using the resources available on the chip. An example of a computational block 300 is illustrated in FIG. 3 that comprises three computing units 312, 322, 342, three memory blocks 314, 324, 334 and twelve look-up tables 316, 326, 336, 346 relatively placed within a 2×2 basic process unit region.

The output is the legal assignment of all the look-up tables and computational blocks on the chip such that $s_{worst}$ is maximized. A placement graph G(V, E) is created based on the connectivity of the input design. The parameters V and E is the set of nodes and edges respectively. Each node v in V represents a component in C. The edge set E is built by constructing a clique over set D∪R for every interconnect i(D,R) in I. Each edge e is assigned an initial weight $w_e=1/(|D|+|R|-1)$. Clearly, every connection has a corresponding edge in the graph while some edges might not have corresponding connections because set E is a superset of the set of all connections.

Figure 7:
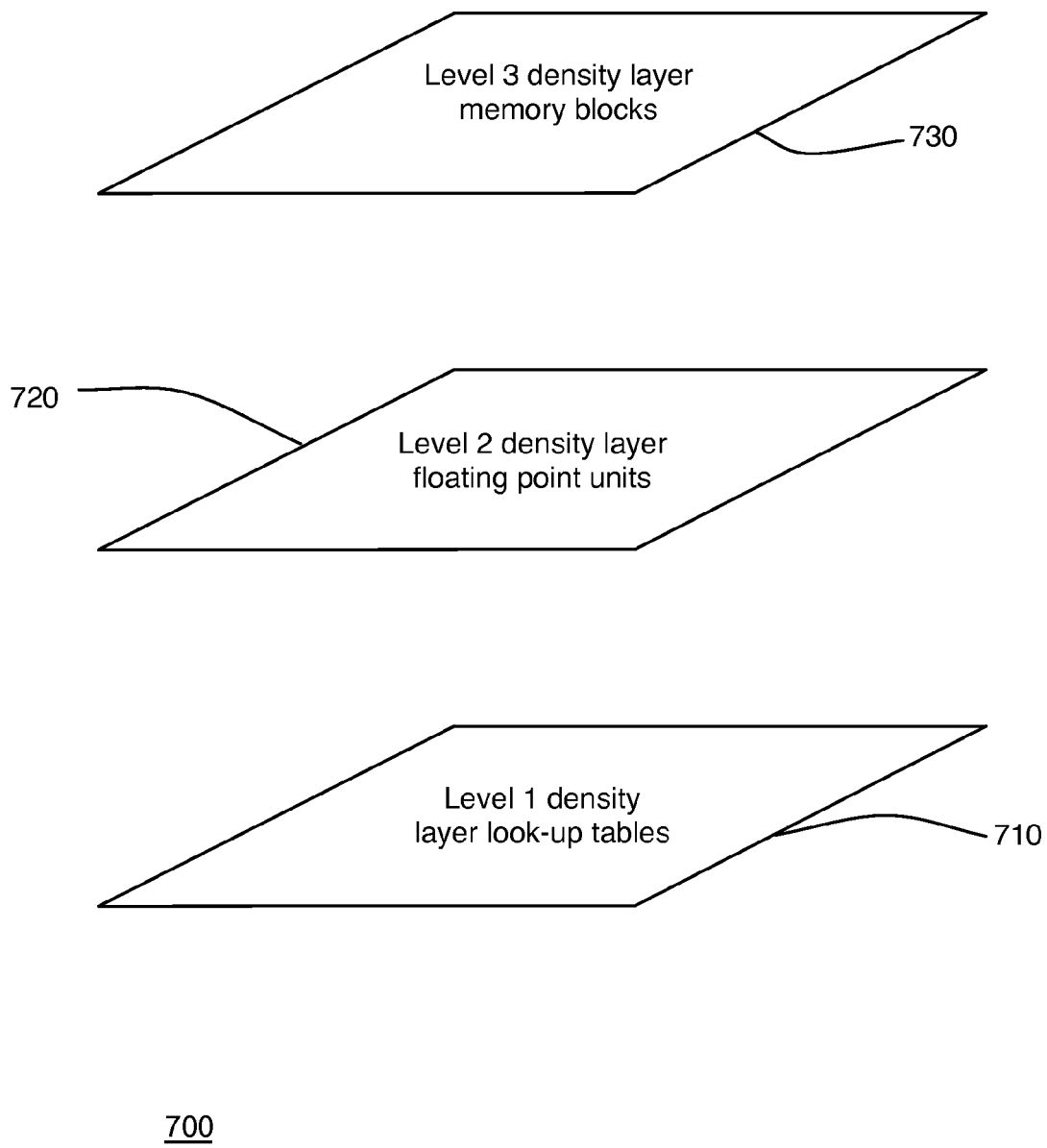
FIG. 7 is a simplified block diagram illustrating one embodiment of the computational block with three density layers in accordance with the present invention.

As described above, a single-layer density system is insufficient to handle complicated placement requirements for heterogeneous field programmable gate arrays. More specifically, each type of architectural resource (a look-up table, a computing unit, a memory block) has its own distribution on the chip. Computing units and memory blocks are typically much more sparsely distributed than look-up tables. A single-layer density system is unable to satisfy these drastically different distribution requirements simultaneously. However, as demonstrated in standard-cell ASIC designs, a single-layer density system can handle homogeneous resources very well. The single-layer density system can be extended to a multi-layer system with each layer modeling a unique placement requirement originating from a particular resource type. For example in one embodiment for the architecture shown in FIG. 2, three layers are constructed, which are used to model the distribution of look-up tables, computing units, and memory blocks during the placement respectively. In another embodiment as illustrated in FIG. 7, the three layers constructed include a first level density layer 710 with look-up tables, a second level density layer 720 with floating point units, and a third level density layer 730 with memories.

Because a component represented by a placement node can contain any type of resource, it contributes differently to different density layer. Before a node is mapped to a density layer, the geometric shape of the node is determined. For different layers, the shape is different. Specifically, a rectangle is chosen with width $W/W_X$ and height $H/H_X$ for a single resource of type X. If a component demands multiple resources of X, multiple rectangles are combined according to the relative position defined by the component. In the following, the computation block 300 in FIG. 3 is used as an example to illustrate how rectangles are combined to form a complex shape.

Figure 4:
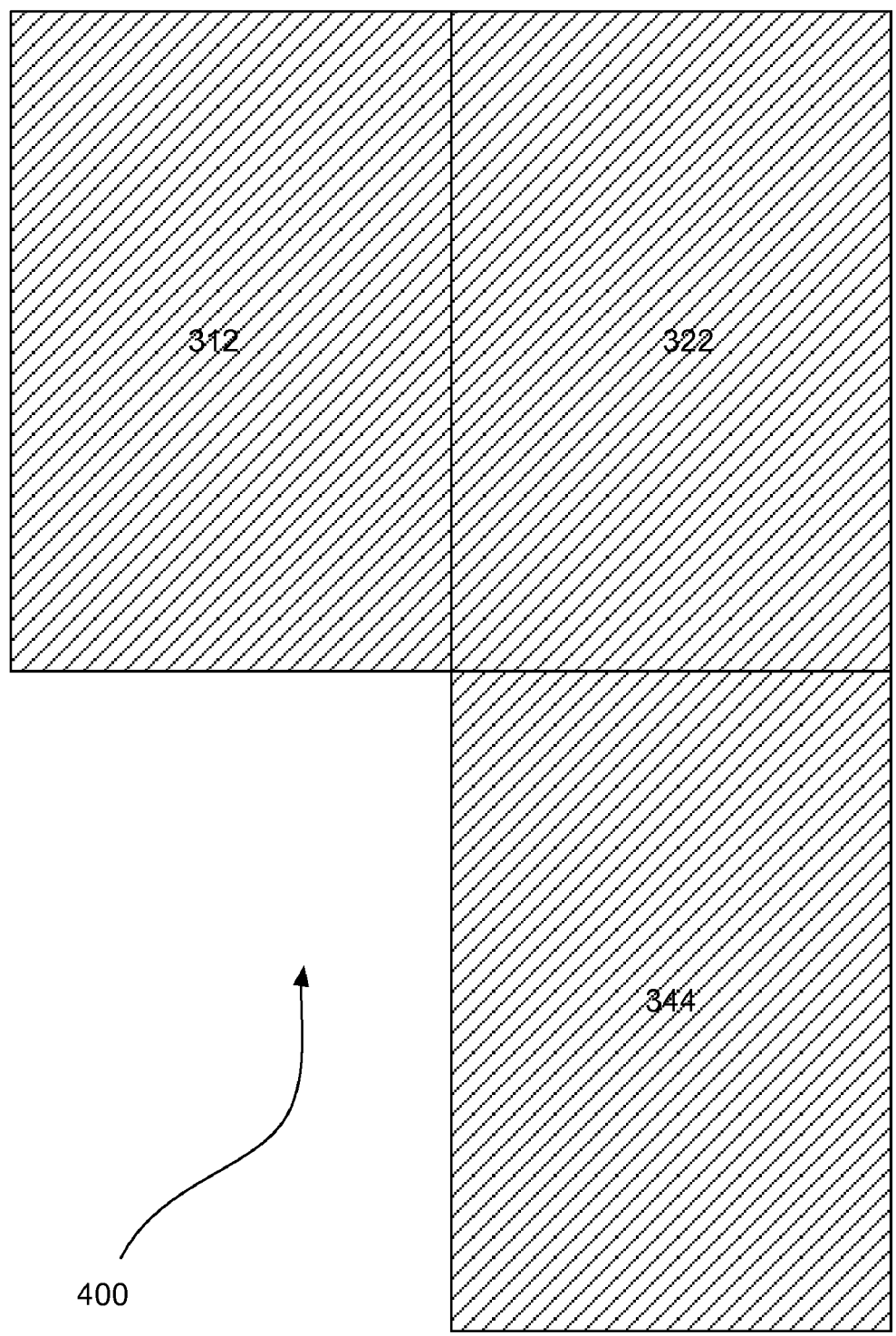
FIG. 4 is a simplified block diagram illustrating a first density layer showing a complex shape of computing units density layer from the computation block in accordance with the present invention.
Figure 5:
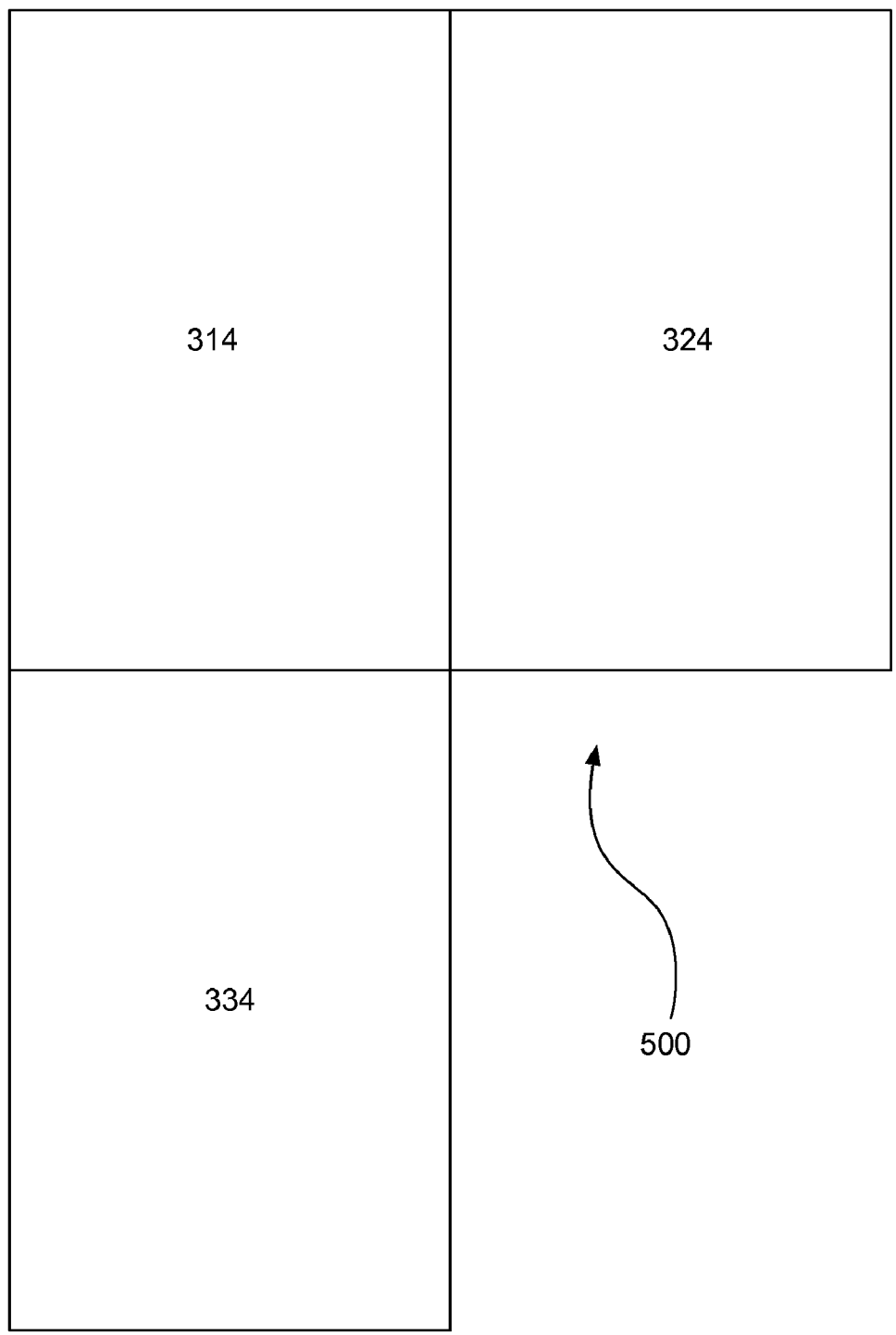
FIG. 5 is a simplified block diagram illustrating a second density layer showing a complex shape of memory block density layer from the computation block in accordance with the present invention.
Figure 6:
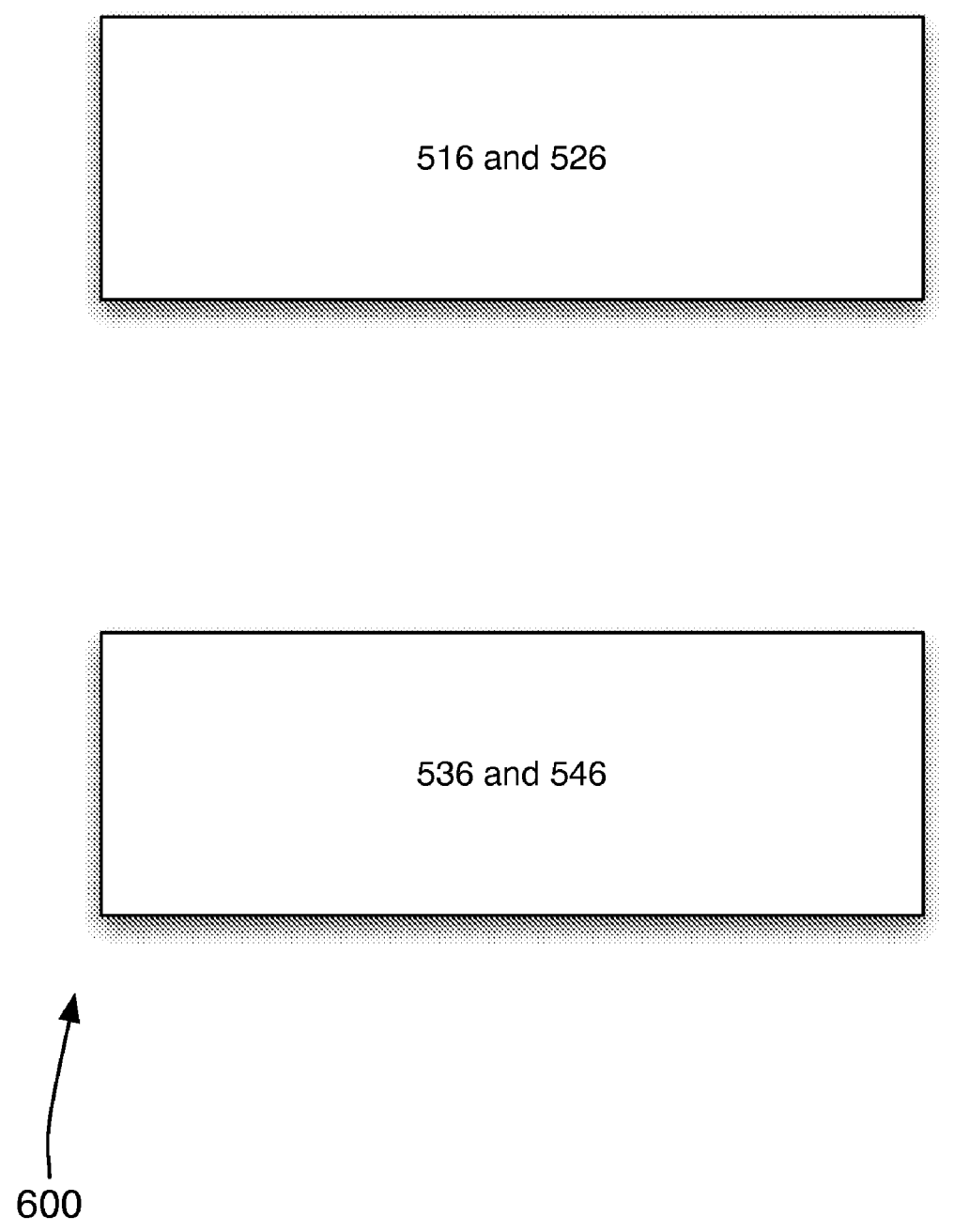

As illustrated in FIG. 4, there is a block diagram 400 showing the complex shape generated for computing units density layer. The given component includes three computing units 312, 322 and 344 organized in an upper triangular shape. It can be seen that the generated shape matches exactly the triangular organization. Similarly, FIG. 5 is a block diagram 500 illustrating shows that the complex shape for memory blocks 314, 324 and 334 resembles the L-shape composition. For twelve look-up tables 516, 526, 536 and 546 from the computation block 300, two parallel strips are generated as shown in a block diagram 600 in FIG. 6.

With the multi-layer density system and the proper shape generation procedure shown above, heterogeneous placement requirements are translated to a set of homogeneous ones, with each of them being handled at a different density layer. In other words, the placer needs to make sure that density is properly distributed for all the layers in order to avoid both resource waste and resource competition. Because computing units and look-up tables are mapped to different density layers, overlapping between computing units and look-up tables is legal and does not cause resource competition.

Figure 8:
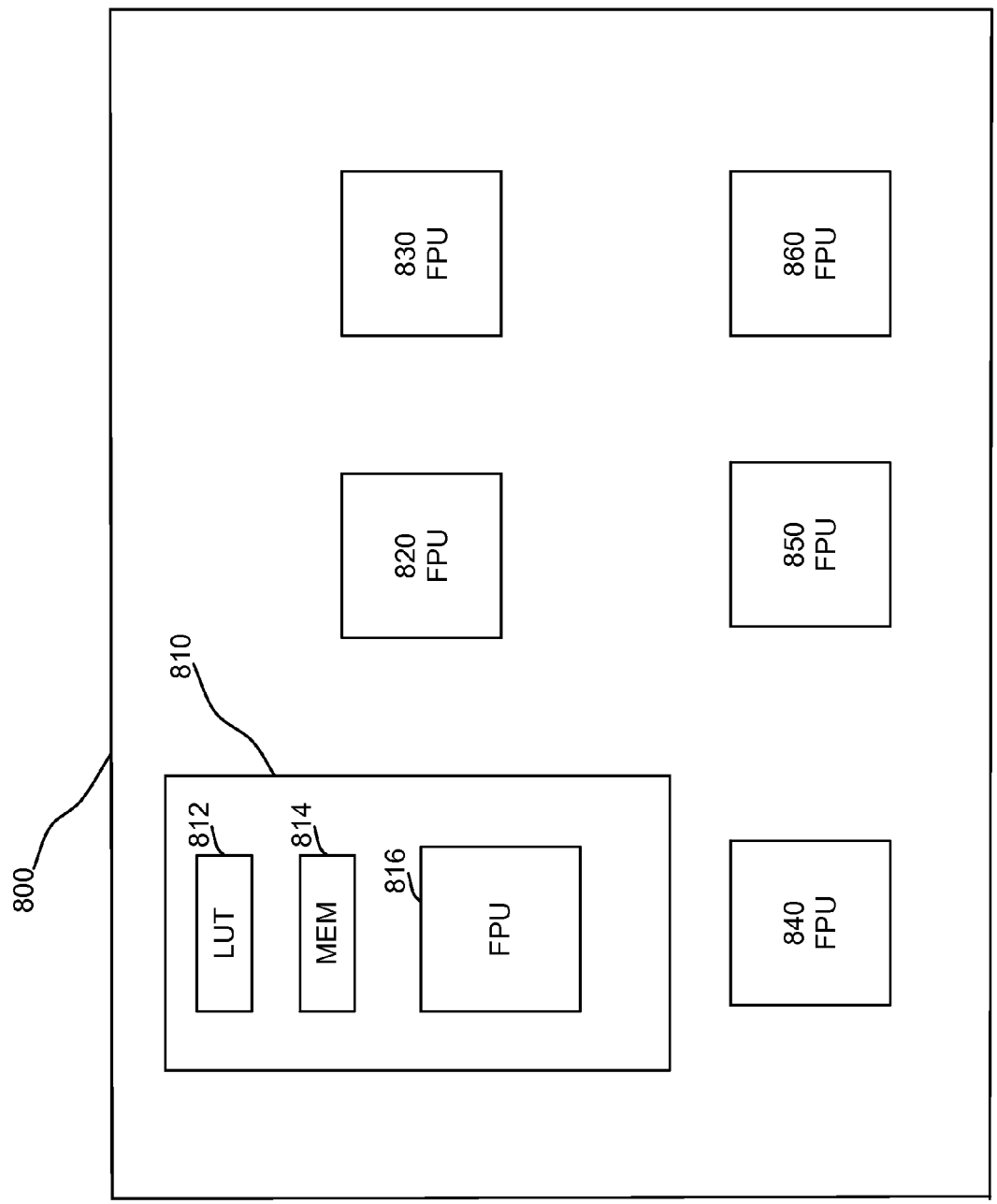
FIG. 8 is a simplified system diagram illustrating one embodiment of a heterogeneous field programmable gate array in accordance with the present invention.

Turning now to FIG. 8, there is shown a simplified system diagram illustrating one embodiment of a heterogeneous field programmable gate array 800. The heterogeneous field programmable gate array 800 comprises a computation block 810 that includes a look-up table 812, a memory 814 and a floating point unit 816. The heterogeneous field programmable gate array 800 further includes other floating point units 820, 830, 840, 850 and 860. One of skill in the art should recognize that other combinations of processors, logics, memories can be designed for implementation in a heterogeneous field programmable gate array.

The multi-layer density system of the present invention can be applied to other placement contexts such as thermal placement. If a design comprises several big power consumers, it is desirable that they are placed far away from each other to even out temperature distribution. This can be done by constructing a two-layer density system with one layer representing the power density.

The multi-layer density system creates multiple placement tasks of different characteristics. In general, geometric shapes generated for sparsely distributed resources (computing units, memory blocks) are usually a lot bigger than those for look-up tables. It is especially true when a computational block involves complicated logic/arithmetic computation. Distribution of these shapes is more like floorplanning than placement in traditional sense. So the problem is how to solve the placement for look-up table layer and the floorplanning for computing unit and memory block layers. One type of solution is to use a combination of a placer and a floorplanner. If the floorplanner and the placer consecutively, a sub-optimal result will be obtained. Since the placement of one layer is intimately influenced by the others, floorplanning computing unit and memory layers first confine the solution space for the subsequent placement in look-up table layer.

In order to handle the floorplanning and the placement simultaneously, a placement expansion is applied to at all layers with a timing optimization scheme. The expansion technique and how density is computed at different layers are described below, followed by the discussion on the a timing-driven placement and floorplan expansion algorithm with multiple density layers.

Expansion refers to the process during which geometric shapes are gradually distributed over a specified region. Expansion is based on fixed-points addition technique. Basically, in analytical placement formulation, nodes tend to cluster to each other due to intrinsic attracting forces induced by connections/edges. The magnitude of an intrinsic force is determined by the weight and the length of the connection. A connection with larger weight and longer length induces stronger intrinsic force. Fixed-points are used to apply additional attracting forces on the nodes and work against intrinsic ones in order to pull the nodes away from high density area. As a result, the peak density usually decreases as expansion proceeds. The placer based on expansion consists of a sequence of expansion iterations. It stops when density distribution satisfies preset criteria.

In this example, a two-dimension bin structure is imposed on each layer. Density at bin b is defined as follows:

$$d(b) = (\sum_n A(b, n))/A(b)$$

where the term $A(b,n)$ represents the intersection area between b and node n; the term $A(b)$ represents the area of bin b. The term $A(b,n)$ is summed up over all nodes intersecting bin b. To compute the density efficiently, the bin size varies at different density layers. A look-up table layer typically has the finest granularity while the ones for memory blocks and computing units are larger depending on the architecture.

A timing-driven expansion algorithm, TD-ML, is shown below.

```
TD-ML {
        Generate initial placement;
    Expansion iterates until some stopping criteria {
        Timing Optimization;
                                For each density layer{
                                Compute
density;
        Compute expansion fixed-points;
        Perform expansion;
        }
    }
            Legalization;
```

An initial placement is generated before expansion starts. Within the expansion loop, the first step is timing optimization. In general, to maximize $s_{worst}$, critical connections should be as short as possible. In this embodiment, it is done by adjusting weights on critical connections. The basic idea is to increase weights on long critical connections such that they become shorter in next expansion iteration. First, timing analyzer is called to calculate slack $s_p$ for all connections and the worst slack $s_{worst}$ based on the present placement. The following weighting strategy is used:

$$w_p[j]=w_p[j-1]\times(1.0+f[j])$$

$w_p[j]$ and $w_p[j-1]$ is the weight for connection p at jth and jth−1 expansion respectively. f[j] is the adjustment factor at jth expansion and determined as follows:

$$f[j] = \begin{cases} 0 & s_p > s_{worst} + \varepsilon \| l_p \le l_{pmin} \\ f_0[j]\left(1 - \frac{s_p - s_{worst}}{\varepsilon}\right) \times \left(\frac{l_p - l_{pmin}}{l_{pmax}}\right) & \text{otherwise} \end{cases}$$

The term $f_0[j]$ represents the preset maximum adjustment factor at jth iteration. As increasing weights on connections adversely affects the expansion process by making it difficult to move nodes due to larger intrinsic attracting forces induced by increased weights, $f_0[j]$ is decreased as the placement proceeds. In this embodiment, the term $f_0[j]$ is set to be 1 and gradually approaches to zero. $\varepsilon$ is a preset value used to decide whether a connection is critical. A connection is critical if $s_p$ is smaller than $s_{worst}+\varepsilon$. $l_p$ is the current length of connection p. $l_{p\ min}$ and $l_{p\ max}$ is the minimum and maximum length of p respectively. $l_{p\ min}$ is determined by enumerating all possible placements for the driver and the receiver component of the connection at all density layers. Simply, $l_{p\ min}$ is the optimum length for connection p. The conditional equation above suggests that a connection gets a non-zero adjustment factor if and only if it is critical and its length is larger than $l_{p\ min}$. Clearly, there is no meaning to further reduce the length beyond $l_{p\ min}$ because any length less than $l_{p\ min}$ is infeasible in the architecture.

$$\left(1 - \frac{s_p - s_{worst}}{\varepsilon}\right)$$

part represents the criticality of a connection. It evaluates to be 1 if a connection is the most critical one.

$$\left(\frac{l_p - l_{pmin}}{l_{pmax}}\right)$$

is used to penalize longer critical connections than shorter ones. If a connection is already close to its minimum length, only a small change in weight might be sufficient.

After the weight for every critical connection is updated, expansion is iterated over all density layers. The expansions are subject to new connection weights and thus work against the updated intrinsic attracting forces. At each layer, the current density distribution is first computed. Then for any placement nodes contributing density at this layer, the expansion fixed-points are computed aiming at reducing highest density through expansion. The expansion fixed-points are properly normalized such that expansions at different density layers are executed at the same pace. The expansion is performed when fixed-points are introduced into the expansion solver and the locations of the nodes are updated when the expansion is done. It is worthy mentioning that even a node does not contribute density at current layer and thus is not assigned an expansion fixed point at this expansion, its location might still be changed due to the fact that all the nodes are interconnected and the movement of a single node might affect all the rest of movable nodes. For instance, the expansion of shapes at computing unit layer might cause relocations of the shapes at look-up table layer.

The expansion described above is iterated until the peak density among all layers is less than a threshold or the number of iterations exceeds a preset maximum number. Following the end of expansions, a legalization procedure is called to fit the components on the input architecture based on the expansion output. As a result, each component is assigned to the closest empty legal location.

The term "computational block" is used interchangeably with the term "functional block". The term "functional unit" refers to a component inside of the computational block, such as a computing unit, a memory block or a look-up table.

The invention has been described with reference to specific exemplary embodiments. Various modifications, adaptations, and changes may be made without departing from the spirit and scope of the invention. For example, the method 100 in a multi-layer density system for placement in a heterogeneous field programmable gate array is intended as one illustration, other step variation can be modified or add without departing from the overall concepts of computing density for each geometric shape of a particular function unit in a functional block using a multi-layer density structure. Accordingly, the specification and drawings are to be regarded as illustrative of the principles of this invention rather than restrictive, the invention is defined by the following appended claims.

I claim:

1. A method for placement of functional units using a multi-layer density system on a heterogeneous field programmable gate array, a functional block having different types of functional units, comprising:

(a) generating a first geometric shape for a functional block in a first layer, the functional block including one or more functional units of a first type;

(b) generating a second geometric shape for the functional block in a second layer, the functional block including one or more functional units of a second type; and (c) computing a density distribution separately for the first geometric shape in the first layer and the second geometric shape in the second layer.

2. The method of claim 1 further comprising repeating steps (a), (b) and (c) until all of the layers in the heterogeneous field programmable gate array having been computed.

3. The method of claim 1, after the step of computing, further comprising computing a force at the first layer.

4. They method of claim 3, further comprising applying the force to the first layer.

5. The method of claim 1, after the step of computing, further comprising computing a force at the second layer.

6. They method of claim 5, further comprising applying the force to the second layer.

7. The method of claim 1 further comprising determining whether each layer has an even layer density distribution.

8. The method of claim 1 wherein the first type of functional units comprises a computing unit.

9. The method of claim 1 wherein the first type of functional units comprises a memory block.

10. The method of claim 1 wherein the first type of function units comprises a look-up table.

11. The method of claim 1 wherein the first type of functional unit comprises a floating point unit.

12. The method of claim 1 wherein the functional block comprises a computational block.

13. A multiple layer density system, comprising:

a plurality of layers, each layer modeling a density distribution of one particular type of functional unit; and a functional block having different types of functional units, each type of functional units corresponding to a particular shape on each layer.

14. The multiple layer density system of claim 13 wherein the functional block comprises a computational block.

15. The multiple layer density system of claim 13 wherein the a first type of function unit comprises a memory.

16. The multiple layer density system of claim 13 wherein the a first type of function unit comprises a floating point unit.

17. The multiple layer density system of claim 13 wherein the a first type of function unit comprises a look-up table.

* * * * *